United States Patent
Hsu et al.

(10) Patent No.: US 7,533,005 B2
(45) Date of Patent: May 12, 2009

(54) SYSTEM AND METHOD FOR CHECKING A REFERENCE PLANE OF A SIGNAL TRACE IN A PCB

(75) Inventors: Shou-Kuo Hsu, Taipei Hsien (TW); Chun-Shan Hsiao, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 41 days.

(21) Appl. No.: 11/768,923

(22) Filed: Jun. 27, 2007

(65) Prior Publication Data
US 2008/0052020 A1    Feb. 28, 2008

(30) Foreign Application Priority Data
Aug. 25, 2006    (CN) .......................... 2006 1 0062295

(51) Int. Cl.
*H03F 1/26*    (2006.01)
(52) U.S. Cl. ...................................... 702/189
(58) Field of Classification Search ................ 702/189; 716/12, 13, 14, 15
See application file for complete search history.

(56) References Cited
U.S. PATENT DOCUMENTS
6,681,353 B1    1/2004    Barrow 2003/0070126 A1    4/2003    Werner et al.
2005/0150105 A1    7/2005    Hayes et al.
2007/0044062 A1 *  2/2007    Fusayasu et al. ............... 716/15

FOREIGN PATENT DOCUMENTS
TW    361630    6/1999
TW    521148    2/2003
TW    589455    6/2004

\* cited by examiner

*Primary Examiner*—Bryan Bui
*Assistant Examiner*—Stephen J Cherry
(74) *Attorney, Agent, or Firm*—Frank R. Niranjan

(57) ABSTRACT

A system for checking a reference plane of a signal trace in a PCB includes: a database, a signal filter, a signal trace selecting unit, a reference plane checking unit and a display unit. The database is configured for storing a plurality of signal files. The signal file in the PCB constitutes one or more signal groups. Each signal group has a same bus. The signal filter is configured for filtering a signal group from a signal file. The signal trace selecting unit is configured for selecting a signal for checking, from the signal group, and for selecting a trace corresponding to the signal. The reference plane checking unit is configured for checking the integrity of a reference plane that is nearest to the selected signal trace through orthographically projecting the selected signal trace to the reference plane and for checking a relationship between the reference plane and the projection. A related method is also disclosed.

11 Claims, 4 Drawing Sheets

SYSTEM AND METHOD FOR CHECKING A REFERENCE PLANE OF A SIGNAL TRACE IN A PCB

BACKGROUND OF THE INVENTION

1. Field of the Invention

The present invention relates to a system and method for checking a reference plane of a signal trace in a printed circuit board (PCB).

2. Description of Related Art

Printed Circuit Boards (PCBs) are electrical systems, having electrical properties just as complicated as the discrete components and devices mounted to them. PCBs are abstracted to a set of basic physical/electrical structures, including: Traces, Planes, vias, and pads. A trace is a physical strip of metal (usually copper) making an electrical connection between two or more points on an X-Y coordinate of a PCB. Traces carry signals between these points, these points being the 2 or more points on an X-Y coordinate of a PCB. A plane is an uninterrupted area of metal covering an entire PCB layer. Planes may distribute power to a number of points on a PCB or it may be a reference ground connected to a number of grounded points on the PCB. Planes are very important in the process of transmission of signals along traces. A via is a physical piece of metal making an electrical connection between two or more points in the z-space of a PCB. Vias carry signals or power between layers of a PCB.

The combination of a signal trace and a reference (power or ground) plane forms a transmission line. All Input/Output (I/O) signals in a PCB system travel through transmission lines. The Input/Output, or I/O, is the collection of interfaces which different functional units (sub-system) of an information processing system use to communicate with each other or with interfacing signals (information theory). A group of transmission lines makes up a bus. Busses are routed on the PCB such that the signal traces are physically adjacent to one another. Good signal integrity in a PCB system is dependent on having transmission lines with controlled impedance. Impedance is determined by the geometry of the traces and the dielectric constant of a material, this material being in the space around the signal trace and between the signal trace and the reference plane.

Return current is an often neglected aspect of transmission lines and their signal integrity. It is incorrect to assume that a signal trace, by itself, forms a transmission line. Currents flowing in a signal trace have an equal and opposite complimentary current flowing in the reference plane beneath them. The relationship of a trace voltage and a trace current to a reference plane voltage and a reference plane current defines the characteristic impedance of a transmission line formed by a trace and a reference plane. The trace current is the current flowing in the signal trace. The trace voltage is the voltage existed in the signal trace. The reference plane current is the current flowing in the reference plane. The reference plane voltage is the voltage existed in the reference plane. An interruption of reference plane continuity beneath a trace is not as dramatic in effect as severing the signal trace, however, the performance of the transmission line and any devices sharing the reference plane is still affected. Thus, it is important to pay attention to reference plane continuity and return paths, it is also important to ensure that every signal has a closely spaced and fully intact return path.

In general, common wiring software can be controlled and the signal structure can be checked, but the integrity of the reference planes can not be checked. What is needed, therefore, is a system and method for avoiding the return current path discontinuities, where the return current path discontinuities are responsible for many signal integrity problems and the return current path discontinuities are related to the electromagnetic interference (EMI) problems as well.

SUMMARY OF THE INVENTION

A system and method for checking a reference plane of a signal trace in a PCB includes: a database, a signal filter, a signal trace selecting unit, a reference plane checking unit and a display unit. The database is configured for storing a plurality of signal files. Each signal file includes information of all signals in the PCB. Each of the PCB signal files constitutes one or more signal groups and each of the one or more signal groups have the same bus. The signal filter is configured for filtering a signal group to be checked from a signal file. The signal trace selecting unit is configured for selecting one signal, from the signal group, for checking and for selecting a trace corresponding to the signal. The reference plane checking unit is configured for checking the integrity of a reference plane that is nearest to the selected signal trace, according to the checked items, corresponding to the selected signal trace through orthographically projecting the selected signal trace to the reference plane and checking a relationship between the reference plane and the projection of the selected signal trace. The display unit is configured for displaying a checked result performed by the reference plane checking unit.

A computer-based method for checking a reference plane of a signal trace in a PCB includes the steps of: obtaining a signal file from a database, the signal file including information of all the signals in the PCB and the signal file constituting one or more signal groups, with each of the one or more signal groups having the same bus; filtering a signal group to be checked from a signal file; selecting one signal for checking from the signal group and selecting a trace corresponding to the selected signal; selecting checked items for the selected signal trace; checking the integrity of a reference plane that is nearest to the selected signal trace, according to the checked items, through orthographically projecting the selected signal trace to the reference plane and checking a relationship between the reference plane and the projection of the selected signal trace; and displaying a checked result and marking the items not passing the integrity check.

Other advantages and novel features of the present invention will become more apparent from the following detailed description of the preferred embodiment when taken in conjunction with the accompanying drawings.

DETAILED DESCRIPTION OF THE INVENTION

Figure 1:
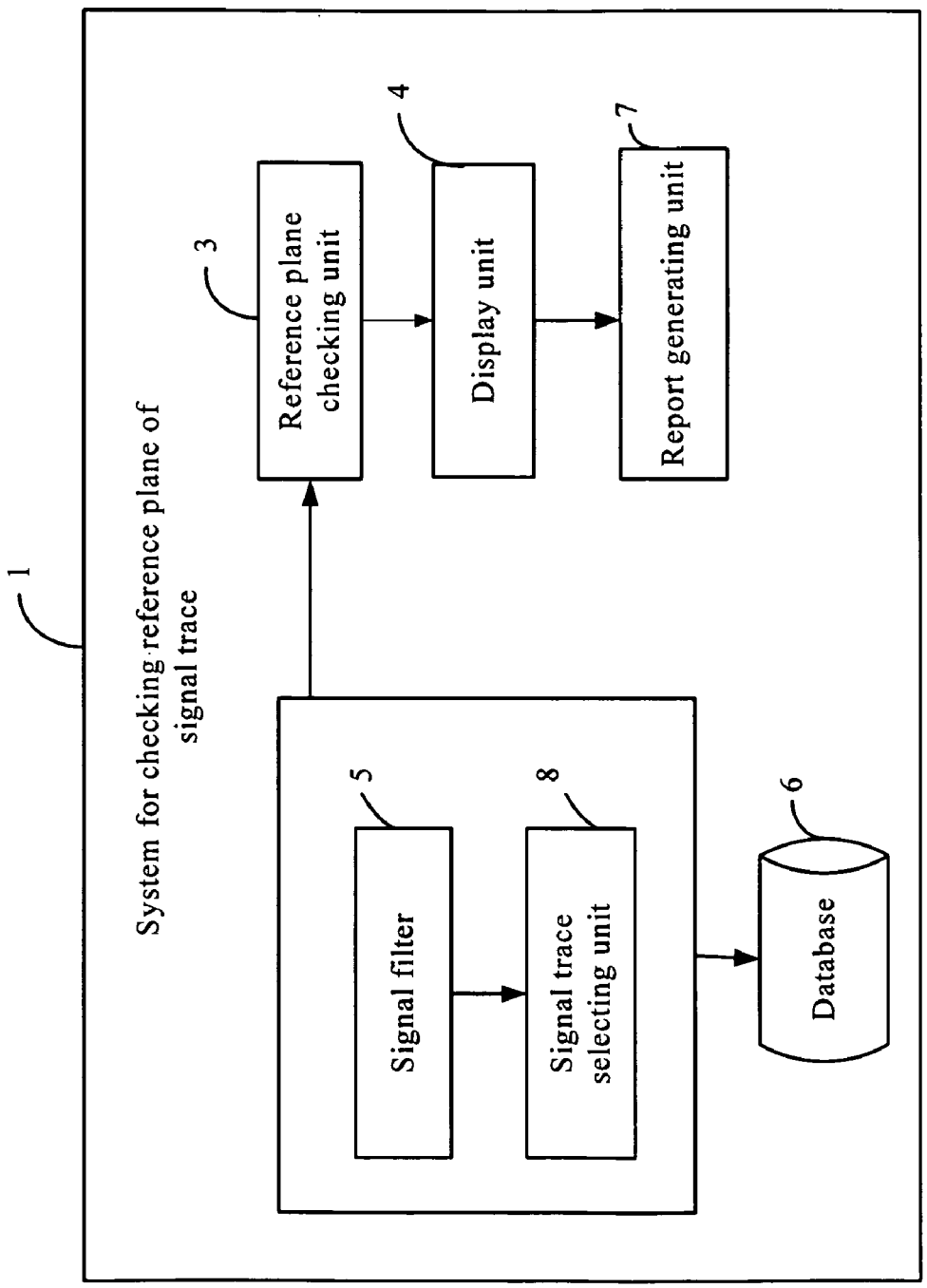
FIG. 1 is a schematic diagram of a system for checking a reference plane of a signal trace in a PCB in accordance with one preferred embodiment, the diagram illustrating the functional units thereof.

FIG. 1 is a schematic diagram of a system for checking a reference plane of a signal trace in a PCB in accordance with one preferred embodiment, the diagram illustrating the functional units thereof. The system typically runs on a computer (not shown), which may be, for example, a personal computer (PC).

In this preferred embodiment (Refer to FIG. 1.), the system mainly includes a database 6, a signal filter 5, a signal trace selecting unit 8, a reference plane checking unit 3, a display unit 4, and a report generating unit 7.

The database 6 is configured for storing a plurality of signal files. Each signal file stored in database 6 is configured for including information of all signals in the PCB. The signal file in the PCB constitutes one or more signal groups and each of the one or more signal groups has a same bus.

The signal filter 5 is configured for filtering a signal group, from a signal file, that is to be checked.

The signal trace selecting unit 8 is configured for selecting one signal or a plurality of signals, from the signal group, for checking. The signal filter 5 filters the selection of the signal or signals to be checked and the signal trace selecting unit 8 is also configured for selecting a trace corresponding to each selected signal in the PCB. In this preferred embodiment, the signal trace selecting unit 8 selects one signal each time from the signal group. In other preferred embodiments, the signal trace selecting unit 8 may select plural signals for checking at the same time and the signal trace selecting unit 8 may select plural traces corresponding to the plural signals.

The reference plane checking unit 3 is configured for checking the integrity of a reference plane that is nearest to the selected signal trace, through orthographically projecting the selected signal trace to the reference plane, and checking a relationship between the reference plane and the projection of the selected signal trace, in order to avoid generating a higher return current and yield more electrical inductance effect.

In this preferred embodiment, checking the relationship between the reference plane and the projection of the selected signal trace includes: checking Continuity, checking Cross-Moat, checking BreakOut and checking MoatDist.

Checking Continuity functions through projecting all segments of the selected signal trace to the reference planes that are nearest to each of the segments, respectively, and by checking whether each of the projections of the segments traverses the same reference plane. That is to say, the selected signal trace includes a plurality of segments; each of the segments of the signal trace is projected on the reference plane that is nearest to the segment. If the projections of all the segments of the selected signal trace traverse at least two different reference planes, the reference plane checking unit 3 reports error. If the projections of all the segments of the selected signal trace traverse the same reference plane, the reference plane checking unit 3 reports that the reference plane of the selected signal trace is continuous. For example, a signal trace is selected from one of the 8 layers of the PCB and the signal trace includes a plurality of segments. Each of the segments is projected on the reference plane that is nearest to the segment, respectively. A few of the projections traverse the ground plane on the 2nd layer and other projections traverse the ground plane on the 7th layer. Although the ground planes traverse on different layers, the reference plane traversed by the selected signal trace is continuous, because of that the name of the reference planes is the same.

Checking CrossMoat functions by checking whether the projection of the selected signal trace overlaps a moat of the reference plane that is nearest to the selected signal trace, so that some parts of the selected signal trace are absent of the reference plane. If the projection overlaps the moat of the reference plane, then the reference plane checking unit 3 reports error. In the preferred embodiment, if the reference plane is a power plane, the moat is a power-moat; if the reference plane is a ground plane, the moat is a ground-moat.

Checking BreakOut functions by checking whether, a first length, the length between the projections of the selected signal trace, from a pin of a component to a first via in the PCB, is greater than a preset maximum length. If the first length is greater than the preset maximum length, the reference plane checking unit 3 reports error. In the preferred embodiment, the preset maximum length may be 100 mils, 200 mils, 300 mils, 500 mils or 1000 mils. 1 mil is equal to one in a thousandth of an inch. The preset maximum length is usually 500 mils. The component, for example, may be any one of the following: integrated circuits, resistors or capacitors.

Checking MoatDist functions by checking whether, a second length, the length between the projection of the selected signal trace and the moat of the reference plane is less than a preset minimum length. If the second length, the length between the projection of the selected signal trace and the moat of the reference plane, is less than the preset minimum length, the reference plane checking unit 3 reports error. The preset minimum length keeps to a 3H-Rule and the preset minimum length falls in between 9~18 mils, in which H represents the vertical height between the signal trace and the reference plane and each H is generally 3~6 mils.

The display unit 4 is configured for displaying a checked result of the reference plane checking unit 3.

The report generating unit 7 is configured for generating a report of all the signals in the group showing the checked result of each reference plane corresponding to each signal trace.

Figure 2:
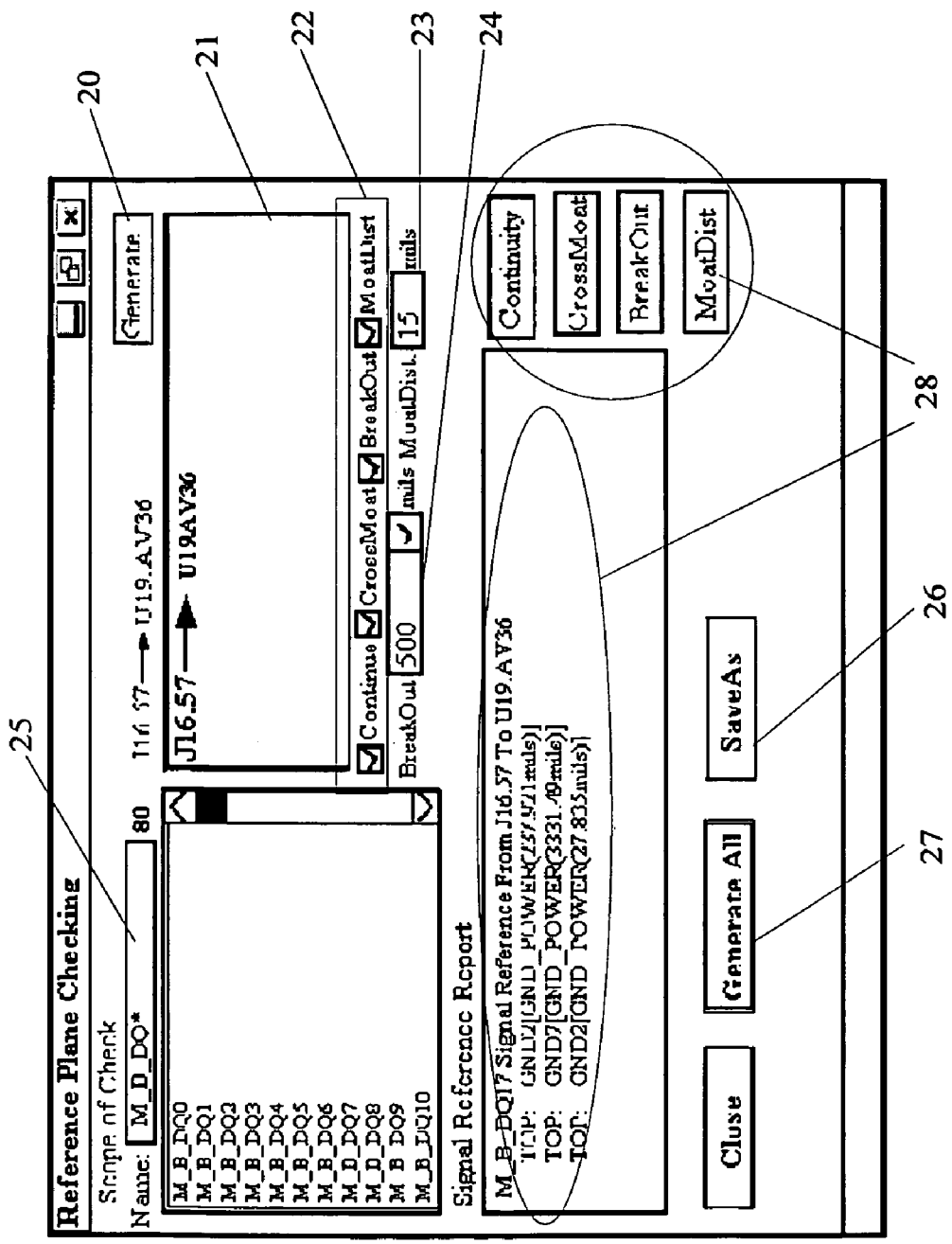
FIG. 2 is an interfacial diagram of the system for checking a reference plane of a signal trace in a PCB in accordance with one preferred embodiment.

FIG. 2 is an interfacial diagram of the system in accordance with one preferred embodiment. In the interfacial diagram, area 25 is a signal filter for a user to filter a group of signals to be checked from a signal file. Area 22 shows the checked items, which includes: Continuity, CrossMoat, BreakOut and MoatDist. Area 24 is a preset maximum length for checking BreakOut. Area 23 is a preset minimum length for checking MoatDist. Area 21 is for displaying the selected signal trace. Button 20 is for performing the reference plane checking. Button 26 is for generating a report of the selected signal trace. Button 27 is for generating a report of all selected signal traces. Area 28 is for displaying the check result.

Figure 3:
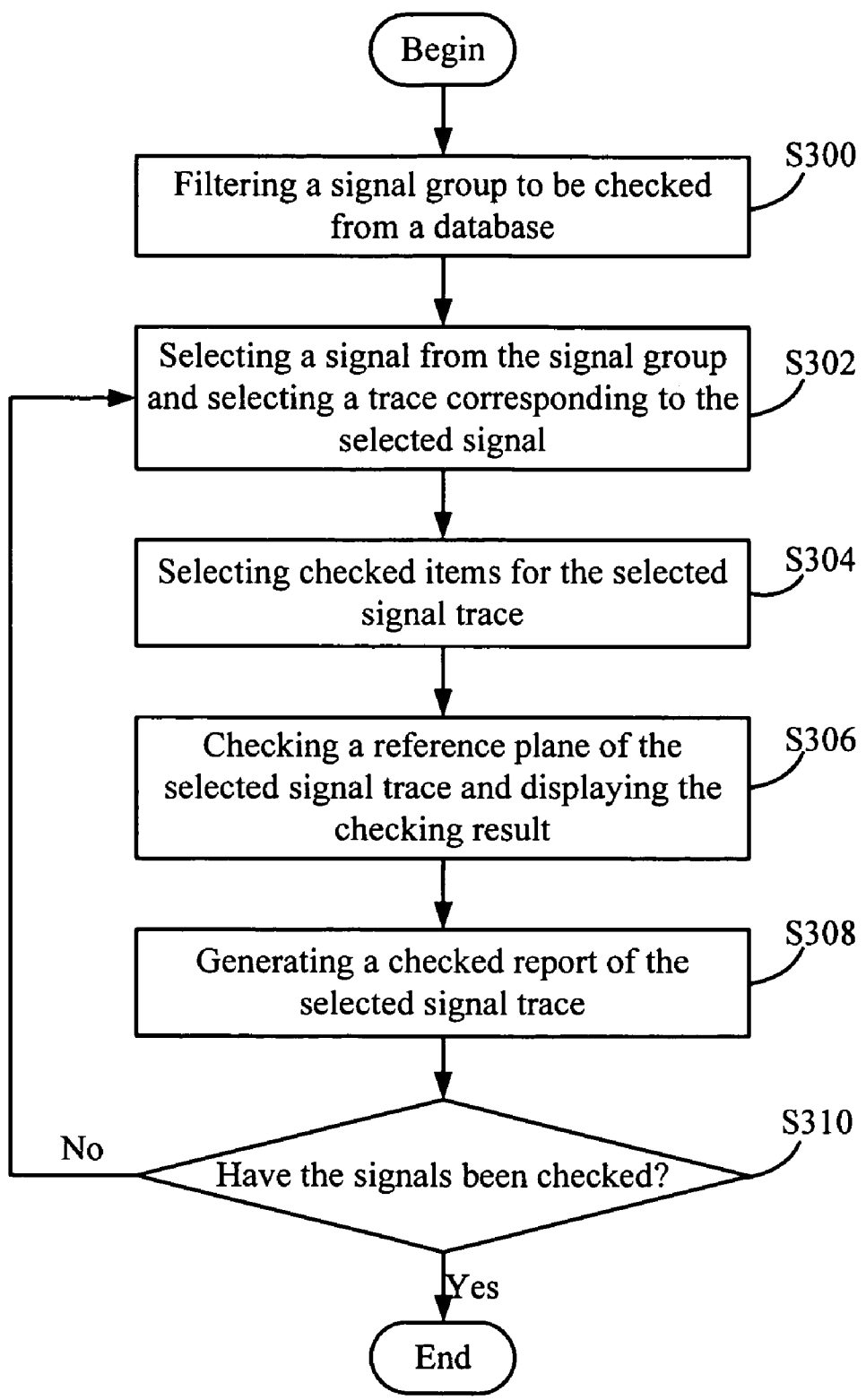
FIG. 3 is a flowchart summarizing a method for checking a reference plane in a PCB in accordance with a preferred embodiment.

FIG. 3 is a flowchart of a preferred method for checking a reference plane of a signal trace in a PCB in accordance with a preferred embodiment. In step S300, a user selects a signal file to be checked from the database 6 via the signal filter 5 and the selection filters a signal group to be checked from the signal file. In step S302, the user selects a signal from the signal group for checking and selects a trace corresponding to the selected signal via the signal trace selecting unit 8.

In step S304, the user selects checked items for the selected signal trace. The checked items may include four optional items: Continuity, CrossMoat, Breakout, and MoatDist.

In step S306, the reference plane checking unit 3 checks the integrity of a reference plane that is nearest to the selected signal trace according to the selection of checked items.

If the user selects checked Continuity, the reference plane checking unit 3 orthographically projects the selected signal trace to the reference plane that is nearest to the selected signal trace, for checking whether the projections of the selected signal traces traverse the same reference plane. If the projection traverses at least two different reference planes, the reference plane checking unit 3 reports error and the display unit 4 displays the checked result and marks a flag on the checked item Continuity.

If the user selects checked CrossMoat, the reference plane checking unit 3 orthographically projects the selected signal trace to the reference plane that is nearest to the selected signal trace, for checking whether the projection of the selected signal trace overlaps a moat of the reference plane. If the projection overlaps the moat of the reference plane, the reference plane checking unit 3 reports error and the display unit 4 displays the checked result and marks a flag on the checked item CrossMoat.

If the user selects checked BreakOut, the reference plane checking unit 3 orthographically projects the selected signal trace to the reference plane that is nearest to the selected signal, for checking whether, a first length, the length between the projections of the selected signal trace from a pin of a component to a first via is greater than a preset maximum length. If the length is greater than the preset maximum length, the reference plane checking unit 3 reports error and the display unit 4 displays the checked result and marks a flag on the checked item BreakOut. In the preferred embodiment, the preset maximum length may be 100 mils, 200 mils, 300 mils, 500 mils or 1000 mils. 1 mil equals one in a thousandth of an inch. The preset maximum length is usually 500 mils.

If the user selects checked MoatDist, the reference plane checking unit 3 orthographically projects the selected signal trace to the reference plane that is nearest to the selected signal trace, for checking whether, a second length, is less than a preset minimum length. If the second length, the length between the projection of the selected signal trace and the moat of the reference plane, is less than the preset minimum length, the reference plane checking unit 3 reports error and the display unit 4 displays the checked result and marks a flag on the checked item MoatDist. The preset minimum length keeps to a 3H-Rule, in which H represents the vertical height between the signal trace and the reference plane. Each H is generally 3~6 mils.

In step S308, the report generating unit 7 generates a report showing the checked result of the reference plane corresponding to the selected signal trace according to the selected checked items.

In step S310, the user determines whether all the signals of the signal group have been checked. If any signal has not been checked, the procedure returns to step S302. Otherwise, the procedure ends.

Figure 4:
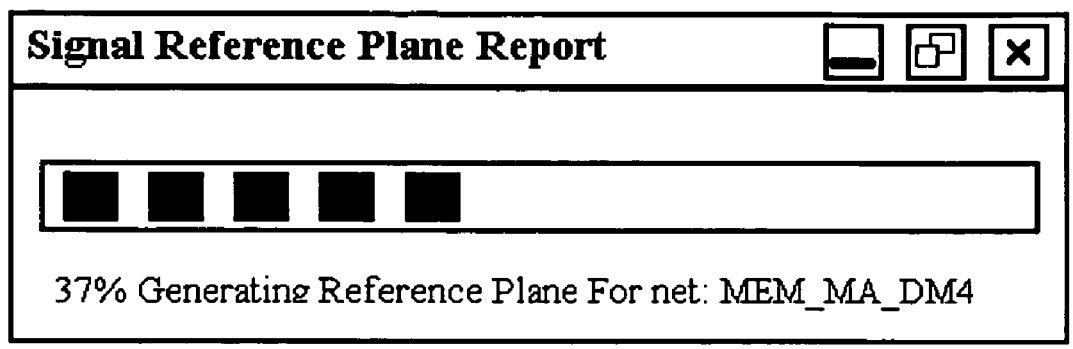
FIG. 4 is a window that pops up when a batch check takes place in accordance with a preferred embodiment.

In step S302, if the user selects a plurality of signals from the signal group and selects the checked items, the display unit 4 pops up a window (refer to FIG. 4) when the checked items take place. The window shows the schedule of batch checking. The reference plane checking unit 3 checks the plural signal traces at the same time and the report generating unit 7 generates a report of all the selected signals showing the result of each reference plane corresponding to each signal trace, according to the selected checked items. FIG. 4 is the window that pops up when a batch check takes place in accordance with a preferred embodiment.

It is to be understood, however, that even though numerous characteristics and advantages of the indicated invention have been set forth in the foregoing description, together with details of the structure and function of the invention, the disclosure is illustrative only and changes may be made in details, especially in matters of shape, size and arrangement of parts within the principles of the invention to the full extent indicated by the broad general meaning of the terms in which the appended claims are expressed.

What is claimed is:

1. A system for checking a reference plane of a signal trace in a PCB, the system comprising:
   a database configured for storing a plurality of signal files, each signal file comprising information of all signals in the PCB, each of the signal files constituting one or more signal groups, and each of the one or more signal groups having a same bus;
   a signal filter configured for filtering a signal group to be checked from a signal file;
   a signal trace selecting unit configured for selecting one signal from the signal group, and selecting a trace corresponding to the signal;
   a reference plane checking unit configured for checking the integrity of a reference plane that is nearest to the selected signal trace, according to checked items, through orthographically projecting the selected signal trace to the reference plane, and checking a relationship between the reference plane and the projection of the selected signal trace;
   a display unit configured for displaying a checked result performed by the reference plane checking unit; and
   a report generating unit configured for generating a report of all the signals in the group, and showing the check result of each reference plane corresponding to each signal trace.

2. The system of claim 1, wherein checking the relationship between the reference plane and the projection of the selected signal trace comprises: checking Continuity, checking CrossMoat, checking BreakOut and checking MoatDist.

3. The system of claim 2, wherein checking Continuity functions is performed by checking whether the projections of the selected signal traces traverse the same reference plane.

4. The system of claim 2, wherein checking CrossMoat functions is performed by checking whether the projection of the selected signal trace overlaps a moat of the reference plane that is nearest to the selected signal trace, so that some parts of the selected signal trace are absent of the reference plane.

5. The system of claim 4, wherein checking BreakOut functions is performed by checking whether a first length between the projection of the selected signal trace from a pin of a component and a first via is greater than a preset maximum length.

6. The system of claim 5, wherein checking MoatDist functions is performed by checking whether a second length between the projection of the selected signal trace and the moat of the reference plane is less than a preset minimum length.

7. A computer-based method for a checking reference plane of a signal trace in a PCB, the method comprising:
   obtaining a signal file from a database, the signal file comprising information of all signals in the PCB, the signal file constituting one or more signal groups, and each of the one or more signal groups having a same bus;
   filtering a signal group to be checked from the signal file;
   selecting one signal for checking from the signal group and selecting a trace corresponding to the selected signal;
   selecting checked items for the selected signal trace;
   checking the integrity of a reference plane that is nearest to the selected signal trace, according to the checked items, through orthographically projecting the selected signal trace to the reference plane, and checking a relationship between the reference plane and the projection of the selected signal trace;
   displaying a check result and marking the checked items not passing the integrity checking; and
   outputting a report of all the signal traces in the group, and showing the checked results of each reference plane corresponding to each signal trace.

8. The system of claim 7, wherein checking the relationship between the reference plane and the projection of the selected signal trace comprises:

checking Continuity which is performed by orthographically projecting the selected signal trace to the reference plane that is nearest to the selected signal trace, for checking whether the projections of the selected signal traces traverse the same reference plane.

9. The system of claim 8, wherein checking the relationship between the reference plane and the projection of the selected signal trace further comprises:

checking CrossMoat which is performed by orthographically projecting the selected signal trace to the reference plane that is nearest to the selected signal trace, for checking whether the projection of the selected signal trace overlaps a moat of the reference plane.

10. The method of claim 9, wherein checking the relationship between the reference plane and the projection of the selected signal trace further comprises:

checking BreakOut which is performed by orthographically projecting the selected signal trace to the reference plane that is nearest to the selected signal trace, for checking whether a first length between the projections of the selected signal trace from a pin of a component and a first via is greater than a preset maximum length.

11. The method of claim 10, wherein checking the relationship between the reference plane and the projection of the selected signal trace further comprises:

checking MoatDist which is performed by orthographically projecting the selected signal trace to the reference plane that is nearest to the selected signal trace, for checking whether a second length between the projection and the moat of the reference plane is less than a preset minimum length.

* * * * *